(12) United States Patent
Farrell et al.

(10) Patent No.: US 10,186,835 B2
(45) Date of Patent: Jan. 22, 2019

(54) MONOLITHIC INTEGRATION OF OPTICALLY PUMPED III-NITRIDE DEVICES

(71) Applicant: The Regents of the University of California, Oakland, CA (US)

(72) Inventors: Robert M. Farrell, Goleta, CA (US); Shuji Nakamura, Santa Barbara, CA (US); Claude C. A. Weisbuch, Paris (FR)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 15/107,812

(22) PCT Filed: Dec. 30, 2014

(86) PCT No.: PCT/US2014/072752
§ 371 (c)(1),
(2) Date: Jun. 23, 2016

(87) PCT Pub. No.: WO2015/103266
PCT Pub. Date: Jul. 9, 2015

(65) Prior Publication Data
US 2016/0322782 A1 Nov. 3, 2016

Related U.S. Application Data

(60) Provisional application No. 61/921,829, filed on Dec. 30, 2013.

(51) Int. Cl.
*H01S 5/04* (2006.01)
*H01L 27/15* (2006.01)
(Continued)

(52) U.S. Cl.
CPC ............ *H01S 5/041* (2013.01); *H01L 27/153* (2013.01); *H01L 33/0075* (2013.01);
(Continued)

(58) Field of Classification Search
CPC ....... H01S 5/2009; H01S 5/041; H01L 33/06; H01L 27/153
(Continued)

(56) References Cited

U.S. PATENT DOCUMENTS 7,851,242 B2 * 12/2010 Bour .................. H01L 33/08
257/14
8,227,328 B2 * 7/2012 Jiang ..................... B82Y 20/00
257/E21.478
(Continued)

FOREIGN PATENT DOCUMENTS

| CN | 103325913 | 9/2013 |
| CN | 103855263 | 6/2014 |

OTHER PUBLICATIONS

Hardy, M.T., et al., "True green semipolar InGaN-based laser diodes beyond critical thickness limits using limited area epitaxy", Journal of Applied Physics, 2013, pp. 183101-1-183101-7, vol. 114.
(Continued)

*Primary Examiner* — Tuan Nguyen
(74) *Attorney, Agent, or Firm* — Gates & Cooper LLP

(57) ABSTRACT

The monolithic integration of optically-pumped and electrically-injected III-nitride light-emitting devices. This structure does not involve the growth of p-type layers after an active region for a first III-nitride light-emitting device, and thus avoids high temperature growth steps after the fabrication of the active region for the first III-nitride light emitting device. Since electrical injection in such a structure cannot be possible, a second III-nitride light-emitting device is used to optically pump the first III-nitride light emitting
(Continued)

device. This second III-nitride light emitting device emits light at a shorter wavelength region of the optical spectrum than the first III-nitride light emitting device, so that it can be absorbed by the active region of the first III-nitride light-emitting device, which in turn emits light at a longer wavelength region of the optical spectrum than the second III-nitride light emitting device.

17 Claims, 10 Drawing Sheets

(51) Int. Cl.
H01L 33/46 (2010.01)
H01S 5/022 (2006.01)
H01S 5/028 (2006.01)
H01S 5/32 (2006.01)
H01S 5/343 (2006.01)
H01S 5/40 (2006.01)
H01L 33/00 (2010.01)
H01L 33/06 (2010.01)
H01L 33/14 (2010.01)
H01L 33/18 (2010.01)
H01L 33/32 (2010.01)
H01S 5/042 (2006.01)
H01S 5/10 (2006.01)
H01S 5/125 (2006.01)
H01L 33/22 (2010.01)
H01S 5/20 (2006.01)

(52) U.S. Cl.
CPC ............. *H01L 33/06* (2013.01); *H01L 33/14* (2013.01); *H01L 33/18* (2013.01); *H01L 33/32* (2013.01); *H01L 33/46* (2013.01); *H01S 5/022* (2013.01); *H01S 5/0287* (2013.01); *H01S 5/042* (2013.01); *H01S 5/1003* (2013.01); *H01S 5/125* (2013.01); *H01S 5/3202* (2013.01); *H01S 5/34333* (2013.01); *H01S 5/4025* (2013.01); *H01S 5/4043* (2013.01); *H01L 33/22* (2013.01); *H01L 2933/0083* (2013.01); *H01S 5/2009* (2013.01); *H01S 5/3213* (2013.01); *H01S 5/4093* (2013.01)

(58) Field of Classification Search
USPC ...................................... 372/44.011
See application file for complete search history.

(56) References Cited

U.S. PATENT DOCUMENTS

| 8,541,869 | B2 | 9/2013 | Nakamura et al. |
| 8,774,246 | B1* | 7/2014 | Deppe ................ H01S 5/18386 372/45.01 |
| 8,860,044 | B2 | 10/2014 | Yeh et al. |
| 2007/0001186 | A1 | 1/2007 | Murai et al. |
| 2011/0101414 | A1 | 5/2011 | Thompson et al. |
| 2012/0031324 | A1* | 2/2012 | Hiromura ................ C30B 25/18 117/94 |
| 2014/0247853 | A1* | 9/2014 | Deppe ................ H01S 5/18308 372/50.11 |
| 2014/0353581 | A1* | 12/2014 | Strassburg ............. H01L 33/08 257/13 |

OTHER PUBLICATIONS

Takeuchi, T., et al., "Quantum-Confined Stark Effect due to Piezoelectric Fields in GaInN Strained Quantum Wells", Jpn. J. Appl. Physics, Apr. 1, 1997, pp. L382-L385, vol. 36, Part 2, No. 4A.

Lefebvre, P., et al., "High internal electric field in a graded-width InGaN○GaN quantum well: Accurate determination by time-resolved photoluminescence spectroscopy", Applied Physics Letters, Feb. 26, 2001, pp. 1252-1254, vol. 18, No. 9.

Grandjean, N., et al., "Built-in electric-field effects in wurtzite AlGaN/GaN quantum wells", Journal of Applied Physics, Oct. 1, 1999, pp. 3714-3720, vol. 86, No. 7.

Im, J.S., et al., "Reduction of oscillator strength due to piezoelectric fields in GaN/AlxGa1-xN quantum wells", Physical Review B, Apr. 15, 1998, pp. R9435-R9438, vol. 57, No. 16.

Della Sala, F., et al., "Free-carrier screening of polarization fields in wurtzite GaN/InGaN laser structures", Applied Physics Letters, Apr. 5, 1999, pp. 2002-2004, vol. 74, No. 14.

Damilano, B., et al., "Metal Organic Vapor Phase Epitaxy of Monolithic Two-Color Light-Emitting Diodes Using an InGaN-Based Light Converter", Applied Physics Express, 2013, pp. 1-4, vol. 6, 092105.

Pourhashemi, A., et al., "Pulsed high-power AlGaN-cladding-free blue laser diodes on semipolar (2021) GaN substrates", Applied Physics Letters, 2013, pp. 151112-1-151112-4, vol. 103.

Takagi, S., et al., "High-Power (over 100mW) Green Laser Diodes on Semipolar {2021} GaN Substrates Operating at Wavelengths beyond 530 nm", Applied Physics Express, 2012, pp. 1-3, vol. 5, 082102.

Yanashima, K., et al., "Long-Lifetime True Green Laser Diodes with Output Power over 50 mW above 525 nm Grown on Semipolar {2021} GaN Substrates", Applied Physics Express, 2012, pp. 1-3, vol. 5, 082101.

Niakamura, S., et al., "InGaNlGaNlAlGaN-based laser diodes with modulation-doped strained-layer superlattices grown on an epitaxially laterally overgrown GaN substrate", Applied Physics Letters, Jan. 12, 1998, pp. 211-213, vol. 72, No. 2.

Kioupakis, E., et al., "Determination of Internal Loss in Nitride Lasers from First Principles", Applied Physics Express, 2010, pp. 082101-1-082101-3, vol. 3.

Hardy, M.T., et al., "Impact of p-GaN Thermal Damage and Barrier Composition on Semipolar Green Laser Diodes", IEEE Photonics Technology Letters, Jan. 1, 2014, pp. 43-46, vol. 26, No. 1.

Keller, S., et al., "Influence of the Structure Parameters on the Relaxation of Semipolar InGaN/GaN Multi Quantum Wells", Japanese Journal of Applied Physics, 2013, pp. 08JC10-1-08JC10-5, vol. 52.

Coldren, L.A., et al., "Diode Lasers and Photonic Integrated Circuits—Second Edition", Wiley Series in Microwave and Optical Engineering, 2012.

Queren, D., et al., "Quality and thermal stability of thin InGaN films", Journal of Crystal Growth, 2009, pp. 2933-2936, vol. 311.

Nakamura, S., et al., "Therman Annealing Effects on P-Type Mg-Doped GaN Films", Jpn. J. Appl. Physics, Feb. 15, 1992, pp. L139-L142, vol. 31, Part 2, No. 2B.

PCT International Search Report & Written Opinion dated Apr. 13, 2015 for PCT Application No. PCT/US14/72752.

PCT International Search Report and Written Opinion dated Apr. 21, 2017 for PCT application No. PCT/US2017/016720.

* cited by examiner

MONOLITHIC INTEGRATION OF OPTICALLY PUMPED III-NITRIDE DEVICES

CROSS REFERENCE TO RELATED APPLICATIONS

This application claims the benefit under 35 U.S.C. Section 119(e) of the following application:

U.S. Provisional Application Ser. No. 61/921,829, filed on Dec. 30, 2013, by Robert M. Farrell, Shuji Nakamura, and Claude C. A. Weisbuch, entitled "MONOLITHIC INTEGRATION OF OPTICALLY PUMPED AND ELECTRICALLY INJECTED III-NITRIDE LIGHT-EMITTING DEVICES,";

which application is incorporated by reference herein.

BACKGROUND OF THE INVENTION

1. Field of the Invention

This invention is related to the monolithic integration of optically-pumped and electrically-injected III-nitride light-emitting devices.

2. Description of the Related Art (Note: This application references a number of different publications as indicated throughout the specification by one or more reference numbers within brackets [Ref. x]. A list of these different publications ordered according to these reference numbers can be found below in the section entitled "References." Each of these publications is incorporated by reference herein.) This invention describes a structure for improving the performance of III-nitride light-emitting devices. The term "III-nitrides" refers to any alloy composition of the (Ga,Al,In,B)N semiconductors having the formula $Ga_wAl_xIn_yB_zN$ where $0 \leq w \leq 1$, $0 \leq x \leq 1$, $0 \leq y \leq 1$, and $0 \leq z \leq 1$.

The usefulness of III-nitrides has been well established for the fabrication of visible and ultraviolet opto-electronic devices and high power electronic devices. Current state-of-the-art III-nitride thin films, heterostructures, and devices are grown along the polar [0001] c-axis. The total polarization of such films consists of spontaneous and piezoelectric polarization contributions, both of which originate from the single polar [0001] c-axis of the wurtzite III-nitride crystal structure. When III-nitride heterostructures are grown pseudomorphically, polarization discontinuities are formed at surfaces and interfaces within the crystal. These discontinuities lead to the accumulation or depletion of carriers at surfaces and interfaces, which in turn produce electric fields. Since the alignment of these polarization-induced electric fields coincides with the typical polar [0001] c-plane growth direction of III-nitride thin films and heterostructures, these fields have the effect of "tilting" the energy bands of III-nitride devices.

In c-plane wurtzite III-nitride quantum wells, the "tilted" energy bands spatially separate the electron and hole wavefunctions. This spatial charge separation reduces the oscillator strength of radiative transitions and red-shifts the emission wavelength. These effects are manifestations of the quantum confined Stark effect (QCSE) and have been thoroughly analyzed for III-nitride quantum wells (QWs). [Refs. 4-7] Additionally, the large polarization-induced electric fields can be partially screened by injected carriers, [Ref 8] making the emission characteristics difficult to engineer accurately.

One approach to decreasing polarization effects in III-nitride devices is to grow the devices on nonpolar planes of the crystal. These include the {11-20} planes, known collectively as a-planes, and the {10-10} planes, known collectively as m-planes, wherein the use of braces, { }, denotes a set of symmetry-equivalent planes, which are represented by the use of parentheses, ( ). Such planes contain equal numbers of gallium and nitrogen atoms per plane and are charge-neutral. Subsequent nonpolar layers are equivalent to one another so the bulk crystal will not be polarized along the growth direction.

Another approach to reducing polarization effects in III-nitride devices is to grow the devices on semipolar planes of the crystal. The term "semipolar plane" can be used to refer to any plane that cannot be classified as c-plane, a-plane, or m-plane. In crystallographic terms, a semipolar plane would be any plane that has at least two nonzero h, i, or k Miller indices and a nonzero l Miller index. Subsequent semipolar layers are equivalent to one another, so the bulk crystal will have reduced polarization along the growth direction.

Despite these inherent advantages, challenges still remain for nonpolar and semipolar device growth. For example, when green III-nitride LEDs and LDs are grown with active regions with high Indium contents, the active region can form extended defects and can easily be degraded by subsequent high temperature growth steps. [Refs. 1,2] In particular, the growth of subsequent p-type layers can be especially damaging, as these layers usually need to be grown at elevated growth temperatures to ensure adequate p-type conduction. [Ref 3]

Thus, there is a need in the art for improved methods of fabricating III-nitride light emitting diodes. The present invention satisfies this need.

SUMMARY OF THE INVENTION

To overcome the limitations in the prior art described above, and to overcome other limitations that will become apparent upon reading and understanding the present specification, the present invention discloses the monolithic integration of optically-pumped and electrically-injected III-nitride light-emitting devices, including light-emitting diodes (LEDs) and laser diodes (LDs). This structure does not involve the growth of p-type layers on an active region for a first III-nitride LED or LD, and thus avoids high temperature growth steps after the fabrication of the active region for the first III-nitride LED or LD. Since electrical injection in such a structure cannot be possible, a second III-nitride LED or LD that is electrically injected is used to optically pump the first III-nitride LED or LD. This second III-nitride LED or LD emits light at a shorter wavelength region of the optical spectrum than the first III-nitride LED or LD, so that the light can be absorbed by the active region of the first III-nitride LED or LD.

BRIEF DESCRIPTION OF THE DRAWINGS

Referring now to the drawings in which like reference numbers represent corresponding parts throughout.

DETAILED DESCRIPTION OF THE INVENTION

Figure 1:
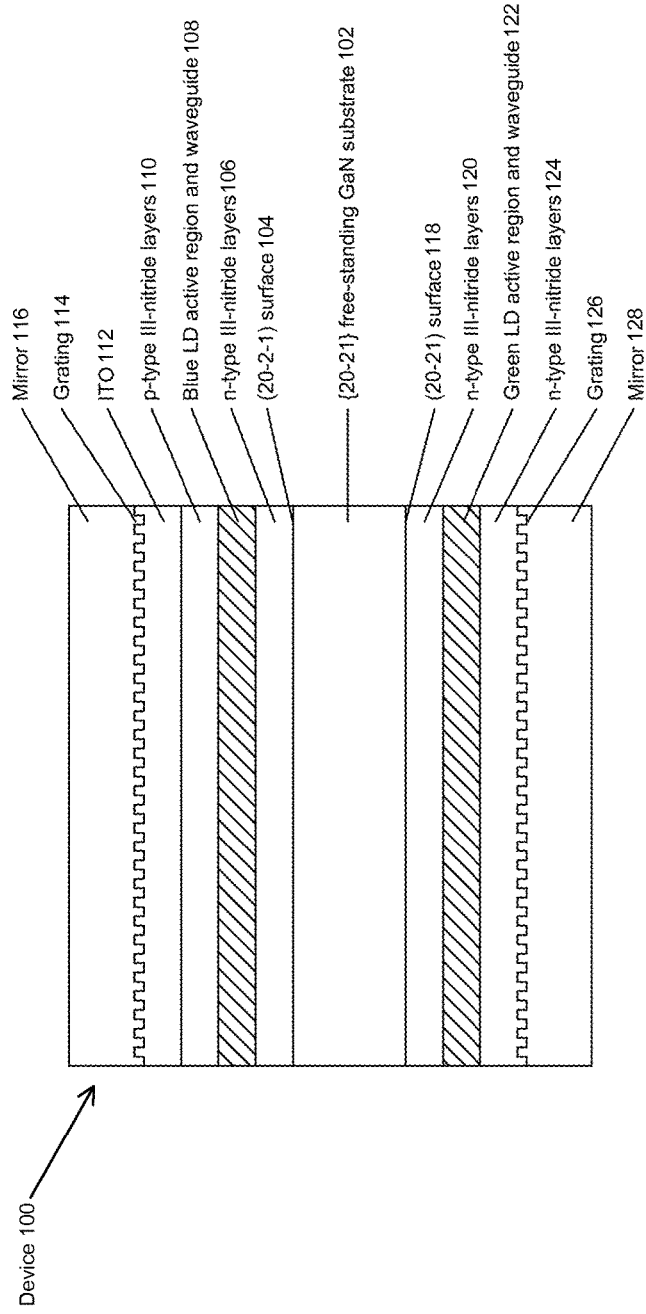
FIG. 1 shows a cross-sectional schematic of the preferred embodiment which involves a monolithically integrated two-laser design where the laser diodes are grown on opposite sides of a substrate and are grating coupled.

In the following description of the preferred embodiment, reference is made to a specific embodiment in which the invention may be practiced. It is to be understood that other embodiments may be utilized and structural changes may be made without departing from the scope of the present invention.

Overview

The motivation underlying the present invention is that semipolar (In)GaN lasers have been theorized to have higher gain and higher radiative efficiency than c-plane (In)GaN devices, due to valence band splitting and lower polarization fields. Nonetheless, green light emitting semipolar III-nitride laser diodes are limited by strain and hole mobility/injection efficiency. Optical pumping of green light emitting semipolar III-nitride laser diodes can address these problems. Monolithically integrating a blue light emitting semipolar III-nitride laser diode to optically pump a green light emitting semipolar III-nitride laser diode on the same chip can thus lead to a green light emitting semipolar III-nitride laser diode with higher wall plug efficiency (WPE).

The benefits of optical pumping include the following:
No use of Magnesium (Mg) in the green light emitting semipolar III-nitride laser diodes, wherein Mg is used for p-type doping of GaN, which is not present in the green light emitting semipolar III-nitride laser diodes, and is a dominant source of loss in III-nitride LDs [14],
No higher temperature growth of p-type GaN layers immediately after the growth of the active region of the green light emitting semipolar III-nitride laser diode, which eliminates thermal damage [15],
Wider design space, because carrier transport not an issue,
Wide barriers to control strain [16], and
Many periods for increased confinement [17].

The structures and functions that provide these benefits are described in more detail below.

TECHNICAL DISCLOSURE

As noted above, when green III-nitride LEDs and LDs are grown with active regions with high Indium contents, the active region can form extended defects and can easily be degraded by subsequent high temperature growth steps. [Refs. 1,2] In particular, the growth of subsequent p-type layers can be especially damaging, as these layers usually need to be grown at elevated growth temperatures to ensure adequate p-type conduction. [Ref 3]

One way to avoid high temperature growth steps after the active region for green III-nitride LEDs and LDs is to design a structure that does not involve the growth of p-type layers after the active region for the green III-nitride LEDs and LDs. Since electrical injection in such a structure cannot be possible, a blue III-nitride LED or LD is needed to optically pump the green III-nitride LED or LD. [Ref 9] This blue LED or LD emits light at a shorter wavelength (e.g. in the blue region of the optical spectrum) than the green LED or LD, so that the light can be absorbed by the green LED or LD.

For the sake of simplicity, the longer wavelength (smaller band gap) "pumped" LED or LD is referred to herein as a first or "green" LED or LD, although it may emit at a wavelength other than green. Likewise, the shorter wavelength (larger band gap) "pumping" LED or LD is referred herein to as a second or "blue" LED or LD, although it may emit at a wavelength other than blue, such as ultraviolet (UV) or violet. Note also that the use of first and second do not imply an order in fabrication, and the first or green LED or LD may be fabricated before or after the second or blue LED or LD.

The following discussion presents two particular examples for illustrating the concept of monolithic integration of optically pumped and electrically injected III-nitride light-emitting devices. Both examples involve green and blue emitting III-nitride LDs, but the concepts can easily be extended to LEDs, as well as light-emitting devices of any other emission wavelength. Thus, these examples are not meant to limit the scope of this invention to LDs or particular emission wavelengths, but rather to illustrate the essential ideas of the invention.

A critical component of this scheme is that the light emitted by the pumping blue LD needs to be properly coupled to the pumped green LD to ensure efficient power transfer. This involves limiting unwanted light scattering, limiting unwanted absorption, and maximizing light absorption by the active region of the green LD.

FIG. 1 shows a cross-sectional schematic of the preferred embodiment which involves a monolithically integrated two-laser design where the LDs are grown on opposite sides of a substrate and are grating coupled.

Specifically, the device structure 100 is based on a {20-21} free-standing GaN substrate 102, wherein the layers for the electrically injected blue LD are grown on a (20-2-1) top surface 104 of the substrate 100 and comprise n-type III-nitride layers 106, a blue LD active region and waveguide 108, p-type III-nitride layers 110, an Indium-Tin-Oxide (ITO) layer 112, a grating structure 114, and a mirror 114. The layers for the optically-pumped green LD are grown on a (20-21) bottom surface 118 of the substrate 100 and comprise n-type III-nitride layers 120, a green LD active region and waveguide 122, n-type III-nitride layers 124, a grating structure 126, and a mirror 128.

First, the electrically injected blue LD is grown on one side 104 of the double-side-polished {20-21} GaN substrate 102, for example, the (20-2-1) side. This orientation has already been used to demonstrate blue LDs with an output power of 2.15 W, a differential efficiency of 49%, and a peak external quantum efficiency (EQE) of 39% [Ref. 10], indicating that it is an appropriate orientation for producing high efficiency pump sources.

Second, the optically pumped green LD is grown on an opposite side 118 of the double-side-polished {20-21} GaN substrate 102, for example, the (20-21) side. This orientation has already been used to demonstrate green LDs with an output power greater than 100 mW, wall plug efficiencies of 7-9%, and lifetimes greater than 5000 hours [Refs. 11,12], indicating that it is an appropriate orientation for producing high performance green LDs.

The green LD is clad by n-type layers 120, 124 on both sides of the active region 122, lowering the temperature of any growth steps that follow the growth of the active region 122 as compared to a typical electrically injected LD. This should help prevent the formation of extended defects in the active region 122 during subsequent growth steps and should significantly improve the performance of the green LDs. [Refs. 1,2]

Several schemes can be used to increase the coupling of the blue LD light into the green LD.

After growing the LDs, a ridge waveguide is etched into the top surface of the blue LD, a grating is etched into the ridge, ITO is deposited on top of the grating, and a mirror is deposited on top of the ITO. On the other side of the side of the substrate, a ridge waveguide is etched into the top surface of the green LD, a grating is etched into the ridge, and a mirror is deposited on top of the grating.

The grating on top of the blue LD is intended to diffract light that is guided by the waveguide of the blue LD into light that is directed toward the green LD. Likewise, the mirror that is on top of the blue LD is intended to reflect light that is propagating away from the green LD back toward the green LD. On the other side of the substrate, the grating on top of the green LD is intended to diffract blue and/or green light that is directed away from the optical cavity of the green LD into light that is guided by the waveguide of the green LD. Similarly, a mirror is deposited on top of the green LD to maximize the absorption of light that is directed perpendicular to the cavity of the green LD. These efforts are all intended to maximize absorption by the green LD.

Figure 2:
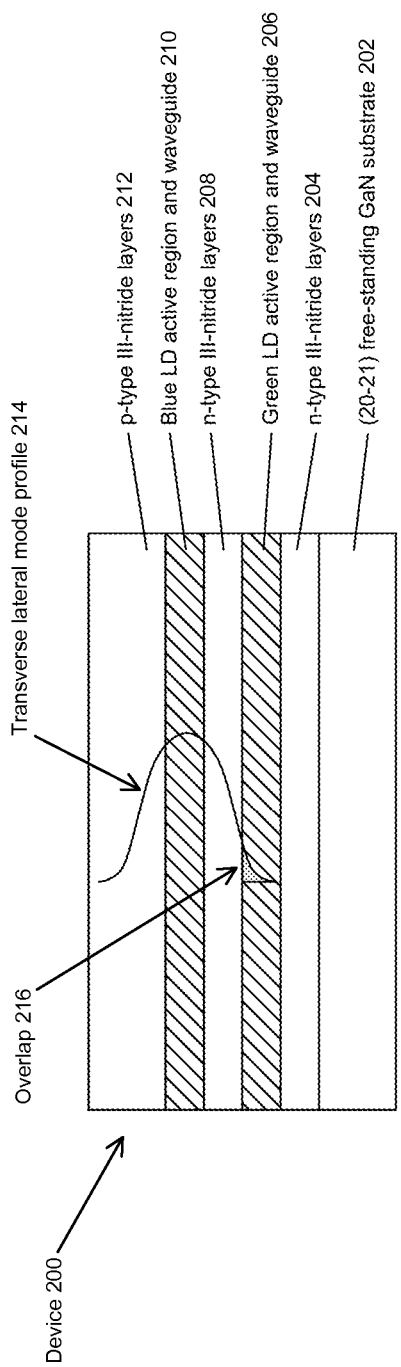
FIG. 2 shows a cross-sectional schematic of an alternative embodiment which involves a monolithically integrated two-laser design where both laser diodes are grown on the same side of a substrate, and are evanescently coupled.

FIG. 2 shows a cross-sectional schematic of an alternative embodiment which involves a monolithically integrated two-laser design where both LDs are grown on the same side of a substrate, and are evanescently coupled. [Ref. 9] (The evanescently coupled design was selected to minimize processing complications and with the hope of higher efficiency.)

Specifically, the device structure 200 is based on a {20-21} free-standing GaN substrate 202, wherein the layers for the optically-pumped green LD are grown on or above the substrate 202 and comprise n-type III-nitride layers 204, a green LD active region and waveguide 206, and n-type III-nitride layers 208 (which are shared with the blue LD). The layers for the electrically injected blue LD are grown on or above the green LD and comprise n-type III-nitride layers 208 (which are shared with the green LD), a blue LD active region and waveguide 210, and p-type III-nitride layers 212.

First, the optically pumped green LD is grown on the {20-21} GaN substrate 202, either on the (20-21) or (20-2-1) surface. The green LD is clad by n-type layers 204, 208 on both sides of the LD, which can stabilize the active region 206 of the green laser diode during the higher temperature growth of the blue laser diode. [Ref. 9]

Second, the electrically injected blue LD is grown directly on top of the green LD. After growing the LDs, a ridge waveguide is etched into the surface of the blue LD and electrical contacts are made to the blue LD. (Note that this reverses the sequence of FIG. 1, where the electrically injected blue LD was grown first followed by the optically pumped green LD.)

Next, high-reflectivity (HR) coatings are applied to both mirror facets of the blue LD, HR coatings are applied to one facet of the green LD, and anti-reflective (AR) coatings are applied to the other facet of the green LD.

As indicated by the transverse lateral mode profile 214, the laser system is designed so that there is overlap between the transverse mode of the blue LD and the quantum wells (QWs) of the green LD, as represented by the shaded area 216 of the transverse lateral mode profile 214. If the overlap 216 is too low, there will not be adequate power transfer between the two LDs, whereas if the overlap 216 is too high the loss in the blue LD may be too high and it may not lase. Thus, the laser system needs to be carefully designed to ensure the proper amount of power transfer between the LDs.

As a means to improve the overlap between the blue and green guided waves, a surface photonic crystal with a high index contrast can be used, such as one that contains air gaps or holes. In such a case, the optical modes of the blue laser waveguide are pushed away from the surface and can interact strongly with the green LD's active region.

Figure 3:
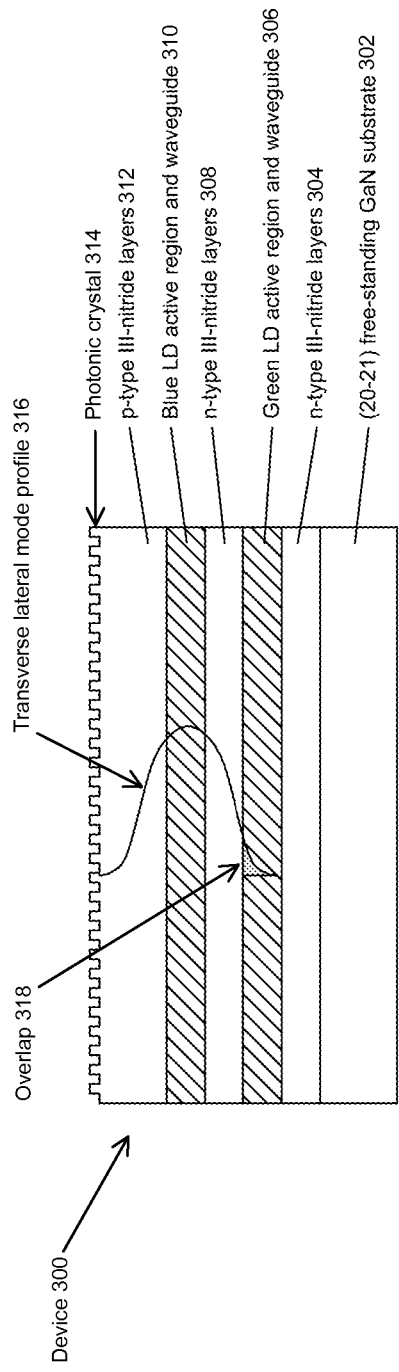
FIG. 3 is a cross-sectional schematic of a monolithically integrated two-laser design where both laser diodes are grown on the same side of a substrate and a surface photonic crystal is used to improve the overlap between the blue and green guided waves.

This potential modification is shown in FIG. 3, which is a cross-sectional schematic of a monolithically integrated two-laser design where both LDs are grown on the same side of a substrate and a surface photonic crystal is used to improve the overlap between the blue and green guided waves.

Specifically, the device structure 300 is based on a {20-21} free-standing GaN substrate 302, wherein the layers for the optically-pumped green LD are grown on or above the substrate 302 and comprise n-type III-nitride layers 304, a green LD active region and waveguide 306, and n-type III-nitride layers 308 (which are shared with the blue LD). The layers for the electrically injected blue LD are grown on or above the green LD and comprise n-type III-nitride layers 308 (which are shared with the green LD), a blue LD active region and waveguide 310, and p-type III-nitride layers 312. On or above the blue LD is a photonic crystal 314, represented by a periodic structure on the surface of the p-type III-nitride layers 312. As indicated by the transverse lateral mode profile 316, there is overlap between the transverse mode of the blue LD and the green LD, as represented by the shaded area 318.

Another way to increase absorption by the green LD active region is to use a separate confinement heterostructure (SCH), wherein the absorption of the blue LD light takes place in a waveguide region with a low concentration of Indium, which can enable the growth of thick absorbing layers. The photoexcited carriers can then relax down in energy into the green light-emitting active region which can be made very thin, thus alleviating the need to grow thick green light-emitting layers; in effect, the functions of absorption and emission of the green LED or LD have been separated. For example, the blue LD could emit at 400 nm, and the waveguide region of the green LD could absorb at 450 nm, while the green light-emitting layers would emit above 500 nm. Typical thicknesses for the green light-emitting layers would be ~3 nm per quantum well (QW), and for the waveguide region would be ~50 nm on each side of the active region.

Figure 4:
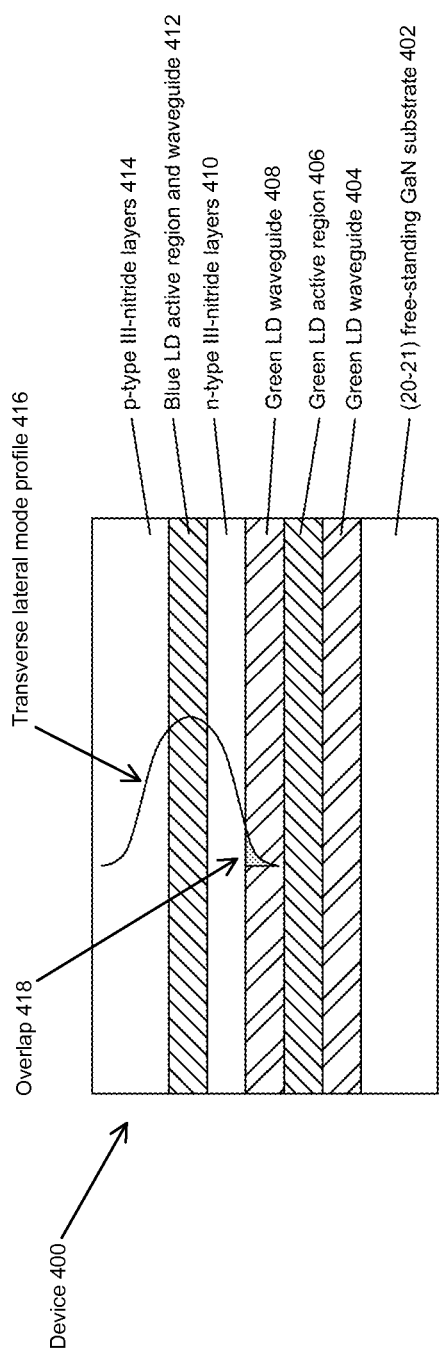
FIG. 4 is a cross-sectional schematic of a monolithically integrated two-laser design where both laser diodes are grown on the same side of a substrate, and the green light emitting laser diode is grown with a waveguide, so that absorption from the blue light emitting laser diode can be take place in a waveguide region with a low concentration in Indium.

This potential modification is shown in FIG. 4, which is a cross-sectional schematic of a monolithically integrated two-laser design where both LDs are grown on the same side of a substrate, and the green LD is grown with a waveguide, so that the absorption of the blue LD light can be take place in an waveguide region with a low concentration in Indium and enable the growth of thick absorbing layers.

Specifically, the device structure 400 is based on a {20-21} free-standing GaN substrate 402, wherein the layers for the optically-pumped green LD are grown on or above the substrate 402 and comprise a green LD waveguide 404, a green LD active region 406, and a green LD waveguide 408. The layers for the electrically injected blue LD are grown on or above the green LD and comprise n-type III-nitride layers 410, a blue LD active region and waveguide 412, and p-type III-nitride layers 414.

The transverse lateral mode profile 416 is also shown, as is the overlap 418 between the transverse modes of the blue LD and the green LD.

Experimental Data

Figure 5B:
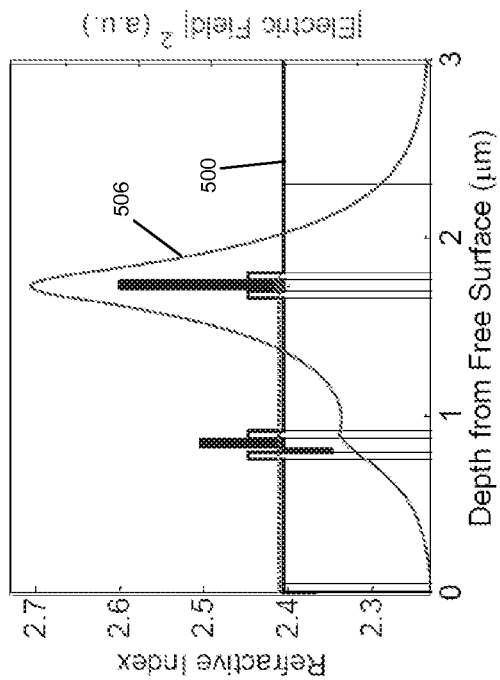
FIGS. 5(a) and 5(b) are graphs that illustrate a simulation of (20-21) coupled laser diodes according to one embodiment of the present invention.
Figure 5A:
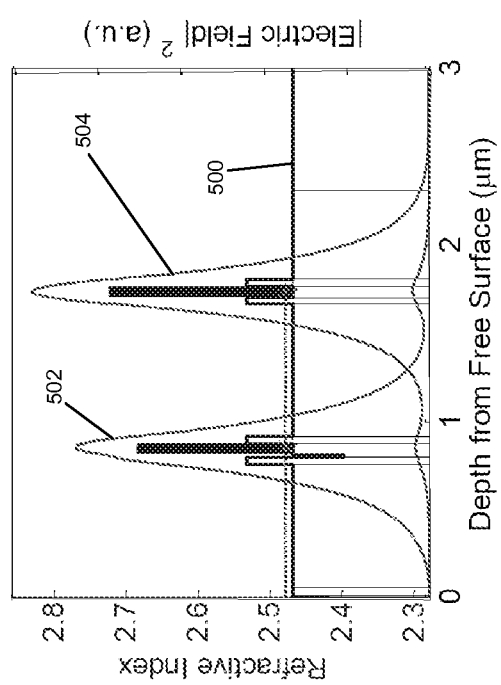

FIGS. 5(a) and 5(b) are graphs that illustrate a simulation of (20-21) coupled LDs according to one embodiment of the present invention. For efficient coupling, the mode overlap must be large enough to pump the green LD to lase, but not too large such that absorption loss from the blue LD to the layers of the green LD will be too large and the blue LD will not reach threshold.

FIG. 5(a) shows a one-dimensional (1D) mode profile for a (20-21) coupled LDs with a 750 nm GaN spacer layer therebetween, wherein the blue line 500 is the refractive index at various depths (µm) from the free surface, the green line 502 is the 450 nm mode, the refractive index is 2.4758, the confinement factor is 0.0335, and the modal loss is 105.1 cm$^{-1}$. The red line 504 shows that the blue LD will not lase, as it is highly dependent on the spacer layer.

In FIG. 5(b), the green line 506 is the 525 nm mode, the refractive index is 2.410, the confinement factor is 0.0223, and the modal loss of 12.1 cm$^{-1}$. The green line 506 shows that the green LD is relatively independent of the spacer layer.

Figure 6:
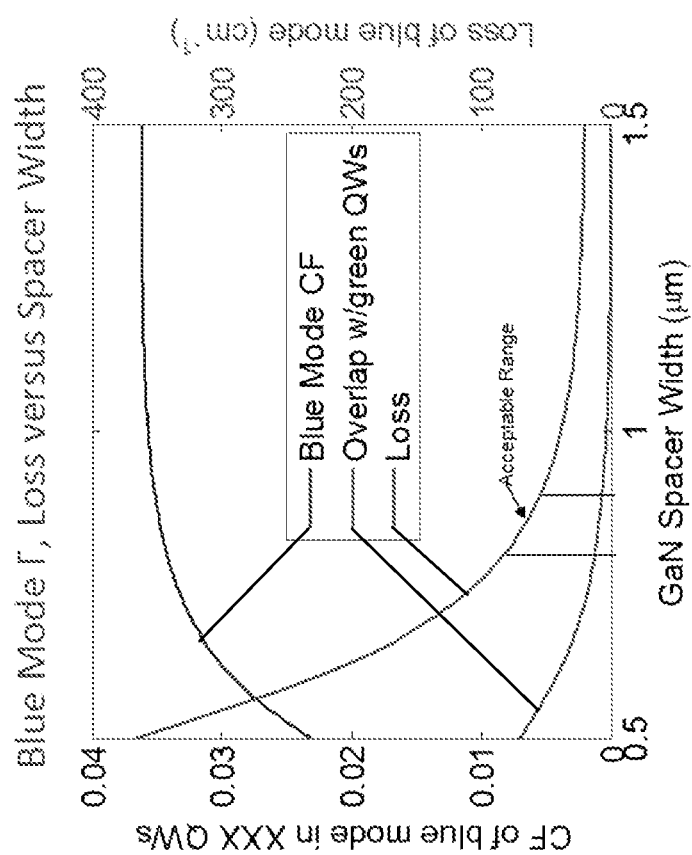
FIG. 6 is a graph of the blue mode confinement factor, and the loss of the blue mode versus spacer width, as well as the overlap with the layers of the green laser diode.

FIG. 6 is a graph of the blue mode confinement factor Γ, and the loss of the blue mode (cm$^{-1}$) vs. the GaN spacer width (µm), as well as the overlap with the layers of the green LD. As noted, the acceptable range for the GaN spacer width was 800-900 nm. This was confirmed using 2D FIMMWAVE simulations.

Figure 7:
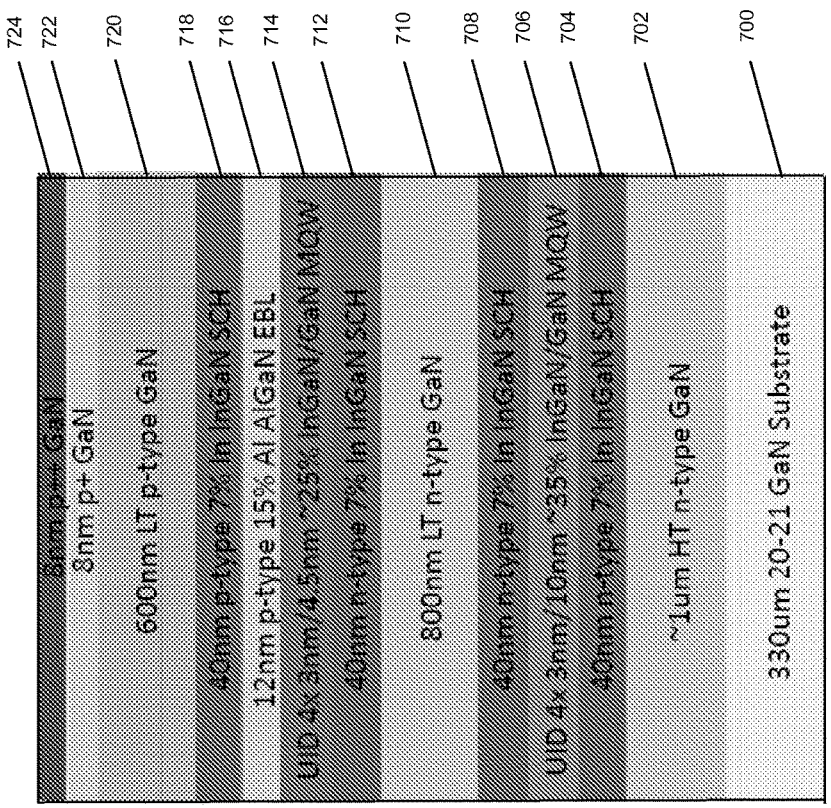
FIG. 7 is a schematic of an epi-structure resulting from the simulations of FIGS. 5(a) and 5(b).

FIG. 7 is a schematic of an epi-structure resulting from these simulations, which includes a 330 µm {20-21} GaN substrate 700, a ~1 µm high temperature (HT) n-type GaN layer 702, a 40 nm n-type InGaN SCH 704 comprised of 7% In, a green active region that comprises unintentionally doped (UID) 4×3 nm/10 nm InGaN/GaN MQWs 706 comprised of ~35% In, a 40 nm n-type InGaN SCH 708 comprised of 7% In, a 800 nm low temperature (LT) n-type GaN layer 710, a 40 nm n-type InGaN SCH 712 comprised of 7% In, a blue active region that comprises UID 4×3 nm/4.5 nm InGaN/GaN MQWs 714 comprised of ~25% In, a 12 nm p-type AlGaN electron blocking layer (EBL) 716 comprised of 15% Al, a 40 nm p-type InGaN SCH 718 comprised of 7% In, a 600 nm LT p-type GaN layer 720, a 8 nm p+ type GaN layer 722, and a 8 nm p++ type GaN Layer 724.

Atomic force microscopy (AFM) images of the epi-structure (not included) showed a 1 nm root-mean-square (RMS) roughness above the LT GaN spacer layer 710 grown after the green active region 706 with no dark triangle defects. Moreover, there were no dark triangle defects after growing the p+-type GaN layer 722 and p++-type GaN layer 724 at elevated temperatures after growth of the blue active region 714, although the conductivity of the contact layer 724 may need further optimization.

Figure 8B:
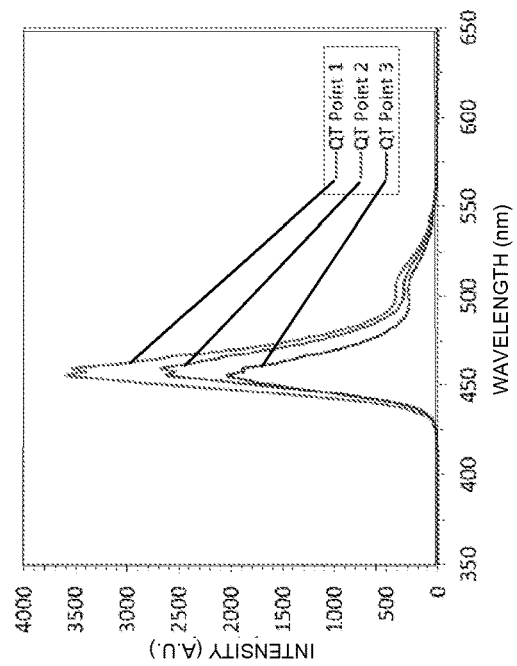
FIG. 8(b) is a graph of the electroluminescence characteristics of the epi-structure of FIG. 7.
Figure 8A:
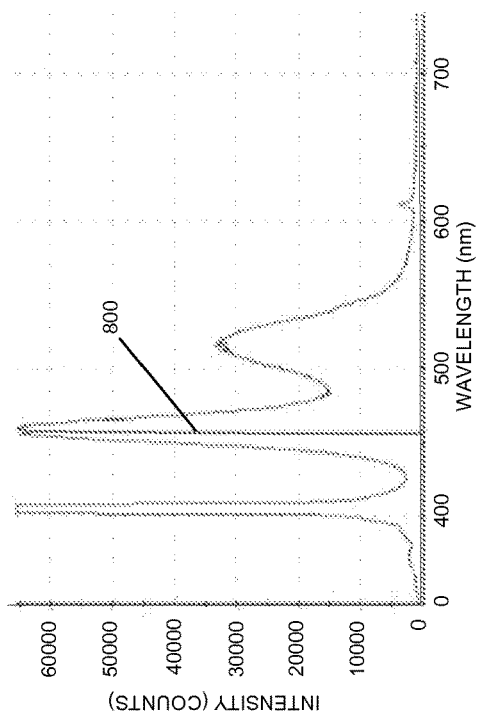
FIG. 8(a) is a graph of the photoluminescence characteristics of the epi-structure of FIG. 7.

FIG. 8(a) is a graph of the photoluminescence characteristics of the epi-structure of FIG. 7, and FIG. 8(b) is a graph of the electroluminescence characteristics of the epi-structure of FIG. 7. From these graphs, the following is noted:
Photoluminescence peaks at 458 nm (FWHM 20) and 515 nm (FHWM 35),
Electroluminescence Quick Test (QT) power at 20 mA is 1.8-2.0 mW at 455 nm, with small green shoulder 800,
This is the same QT power as a blue LD on a HT template grown in run immediately after, and
Repeatable growth is possible.

Figure 9:
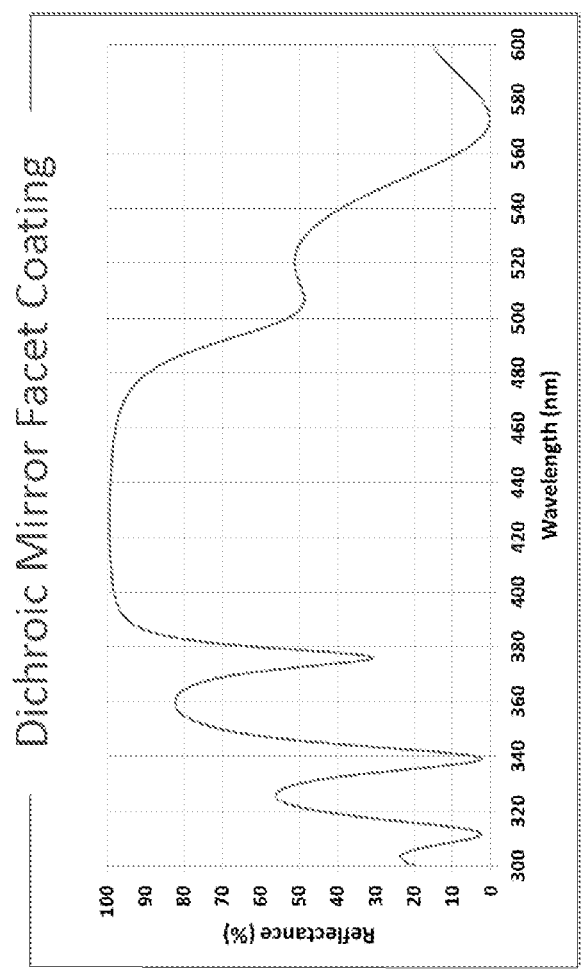
FIG. 9 is a graph that shows the reflectance required of dichroic mirror facet coatings.

Although it is early in device development, a number of improvements can be foreseen:
A top-side n-contact is necessary for more efficient injection,
Dichroic mirror facet coatings of 100% reflectance (R) in the blue region and tunable R in the green region must be developed as shown in FIG. 9, and
Facet formation must be optimized for deeply etched facets.

Nonetheless, the following conclusions can be made:
Growth experiments indicate growth of two III-nitride emitters on one side of a semipolar substrate is possible without any detrimental effects, and
Simulations show the potential for efficient coupling between the emitters.

Process Steps for the Invention

Figure 10:
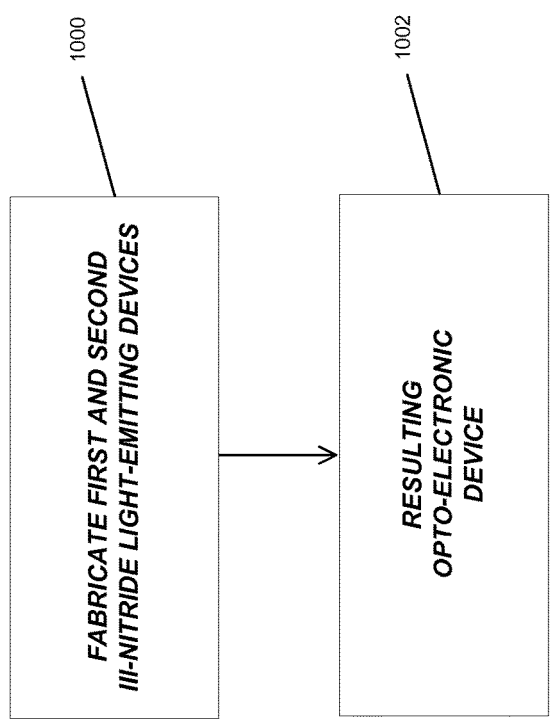
FIG. 10 is a flowchart illustrating the process steps of a method for fabricating an opto-electronic device according to one embodiment of the present invention.

FIG. 10 is a flowchart illustrating the process steps for a method of fabricating an opto-electronic device according to one embodiment of the present invention.

Block 1000 represents the step of fabricating first and second III-nitride light-emitting devices comprised of one more III-nitride layers grown on or above one or more surfaces of a substrate, wherein: an active region of the first III-nitride light-emitting device is clad on both sides only by undoped or n-type III-nitride layers and is not clad by p-type III-nitride layers; an active region of the second III-nitride light-emitting device is clad on opposite sides by n-type and p-type III-nitride layers; the first III-nitride light-emitting device has a smaller band gap than the second III-nitride light-emitting device; the first III-nitride light-emitting device is optically pumped by the second III-nitride light-emitting device; and the second III-nitride light-emitting device is electrically injected.

The second III-nitride light-emitting device emits light at a shorter wavelength than the first III-nitride light-emitting device, so that the light can be absorbed by the active region of the first III-nitride light-emitting device.

In a first embodiment, the first and second III-nitride light-emitting devices are grown on opposite sides of the substrate. In this embodiment, the second III-nitride light-emitting device is grown first, and the first III-nitride light-emitting device is grown after the second III-nitride light-emitting device, wherein the substrate is a {20-21} III-nitride substrate, the first III-nitride light-emitting device is grown on or above a (20-21) or (20-2-1) surface of the {20-21} III-nitride substrate, and the second III-nitride light-emitting device is grown on or above a (20-2-1) or (20-21) surface of the {20-21} III-nitride substrate, respectively.

In the first embodiment, the device may further be comprised of: a grating formed on or above the second III-nitride light-emitting device that diffracts light that is guided by a waveguide of the second III-nitride light-emitting device into light that is directed toward the first III-nitride light-emitting device; a mirror formed on or above the second III-nitride light-emitting device that reflects light that is propagating away from the first III-nitride light-emitting device towards the first III-nitride light-emitting device; a grating formed on or above the first III-nitride light-emitting device that diffracts light that is directed away from the first III-nitride light-emitting device into light that is guided by a waveguide of the first III-nitride light-emitting device; and/or a mirror formed on or above the first III-nitride light-emitting device that reflects light that is directed perpendicular to an optical cavity of the first III-nitride light-emitting device.

In a second embodiment, the first and second III-nitride light-emitting devices are grown on the same side of the substrate, wherein the substrate is a {20-21} III-nitride substrate, and both the first and second III-nitride light-emitting devices are grown on or above a (20-21) surface of the {20-21} substrate or a (20-2-1) surface of the {20-21} substrate. In this embodiment, the first III-nitride light-emitting device is grown first, and the second III-nitride light-emitting device is grown after the first III-nitride light-emitting device, and the first and second III-nitride light-emitting devices share n-type III-nitride layers. The undoped or n-type III-nitride layers on both sides of the active region of the first III-nitride light-emitting device stabilize the active region of the first III-nitride light-emitting device during growth of the second III-nitride light-emitting device.

In the second embodiment, the device may further be comprised of: a photonic crystal to improve overlap of the second III-nitride light-emitting device's optical modes with the active region of the first III-nitride light-emitting device; and/or a separate confinement heterostructure to increase absorption of the second III-nitride light-emitting device's optical modes by the active region of the first III-nitride light-emitting device.

In addition, the first III-nitride light-emitting device may have a waveguide and absorption of the light from the second III-nitride light-emitting device takes place in the waveguide.

The first III-nitride light-emitting device may also be grown on a limited area of the substrate to decrease the strain in the layers.

Finally, Block 1002 represents the resulting opto-electronic device.

Modifications and Alternatives for the Invention

The scope of this invention covers more than just the semipolar orientations (20-21) and (20-2-1) cited in the technical description. This idea is also pertinent to all semipolar planes that can be used for growing high performance III-nitride LEDs and LDs. The term "semipolar plane" can be used to refer to any plane that cannot be classified as c-plane, a-plane, or m-plane. In crystallographic terms, a semipolar plane would be any plane that has at least two nonzero h, i, or k Miller indices and a nonzero l Miller index. Subsequent semipolar layers are equivalent to one another so the bulk crystal will have reduced polarization along the growth direction.

Likewise, the scope of this patent is also pertinent to all nonpolar planes that can be used for growing high performance III-nitride LEDs and LDs. These include the {11-20} planes, known collectively as a-planes, and the {10-10} planes, known collectively as m-planes. Such planes contain equal numbers of gallium and nitrogen atoms per plane and are charge-neutral. Subsequent nonpolar layers are equivalent to one another so the bulk crystal will not be polarized along the growth direction.

Finally, the scope of this patent is also pertinent to all polar planes that can be used for growing high performance III-nitride LEDs and LDs. These include the (0001) plane, known as Ga-polar c-plane, and the (000-1) plane, known as N-polar c-plane. Such planes are terminated by a single type of atom and are polarized along the growth direction.

The scope of this invention also covers III-nitride LEDs and LDs with various active region designs. This idea is also pertinent to III-nitride LEDs and LDs with active regions with only one QW, active regions with more than one QW, active regions with QWs of any thickness, active regions with QWs of any alloy composition, active regions with barriers of any thickness, and active regions with barriers of any alloy composition.

Additional impurities or dopants can also be incorporated into the semipolar III-nitride thin films described in this invention. For example, Fe, Mg, Si, and Zn are frequently added to various layers in III-nitride heterostructures to alter the conduction properties of those and adjacent layers. The use of such dopants and others not listed here are within the scope of the invention.

The III-nitride LEDs and LDs described above were comprised of multiple homogenous layers. However, the scope of this invention also includes III-nitride LEDs and LDs comprised of multiple layers having varying or graded compositions such as separate confinement heterostructures.

Moreover, substrates other than free-standing semipolar GaN could be used for III-nitride thin film growth. The scope of this invention includes the growth of semipolar III-nitride thin films on all possible crystallographic orientations of all possible foreign substrates. These foreign substrates include, but are not limited to, sapphire, silicon carbide, silicon, zinc oxide, boron nitride, lithium aluminate, lithium niobate, germanium, aluminum nitride, lithium gallate, partially substituted spinels, and quaternary tetragonal oxides sharing the $\gamma$-LiAlO$_2$ structure.

Furthermore, variations in semipolar III-nitride nucleation (or buffer) layers and nucleation layer growth methods are acceptable for the practice of this invention. The growth temperature, growth pressure, orientation, and composition of the nucleation layers need not match the growth temperature, growth pressure, orientation, and composition of the subsequent semipolar thin films and heterostructures. The scope of this invention includes the growth of semipolar III-nitride thin films on all possible substrates using all possible nucleation layers and nucleation layer growth methods.

The scope of this invention also covers semipolar III-nitride thin films grown on epitaxial laterally overgrown (ELO) III-nitride templates. The ELO technique is a method of reducing the density of threading dislocations (TD) in subsequent epitaxial layers. Reducing the TD density leads to improvements in device performance. For c-plane III-nitride LEDs and LDs, these improvements include increased output powers, increased internal quantum efficiencies, longer device lifetimes, and reduced threshold current densities. [Ref. 13] These advantages will be pertinent to all semipolar III-nitride LEDs and LDs grown on ELO templates.

Free-standing semipolar III-nitride substrates may also be created by removing a foreign substrate from a thick semipolar III-nitride layer, by sawing a bulk III-nitride ingot or boule into individual semipolar III-nitride wafers, or by any other possible crystal growth or wafer manufacturing technique. The scope of this invention includes the growth of semipolar III-nitride thin films on all possible free-standing semipolar III-nitride wafers created by all possible crystal growth methods and wafer manufacturing techniques.

Different surfaces of the {20-21} III-nitride substrate may be used than those disclosed herein. For example, although the above description for FIG. 1 refers to the blue LD being grown on or above a (20-2-1) surface of the {20-21} GaN substrate and the green LD being grown on or above a (20-21) surface of the {20-21} GaN substrate, these surfaces could reversed for the green and blue LDs.

Advantages and Benefits of the Invention

The realization of semipolar III-nitride LEDs and LDs would potentially allow for multiple advances in the manufacturability of III-nitride LEDs and LDs. Growth of III-nitride LEDs and LDs on semipolar planes could significantly improve device performance by decreasing polarization-induced electric fields and reducing the valence band density states through unbalanced biaxial strain induced splitting of the heavy hole and light hole bands. Decreasing polarization-induced electric fields should increase the radiative efficiency in III-nitride LEDs. Likewise, decreasing polarization-induced electric fields and reducing the valence band density states should decrease the current densities necessary to generate optical gain in III-nitride LDs. This should lead to significantly less heating in nitride LEDs and LDs, which should result in higher efficiency, longer device lifetimes and higher production yields for device manufacturers.

However, when green III-nitride LEDs and LDs are grown with active regions with high Indium contents, the active region can form extended defects and can easily be degraded by subsequent high temperature growth steps. [Refs. 1,2] In particular, the growth of subsequent p-type layers can be especially damaging, as these layers usually need to be grown at elevated growth temperatures to ensure adequate p-type conduction. [Ref. 3] One way to avoid high temperature growth steps after the active region for green III-nitride LDs is to design a structure that does not involve the growth of p-type layers after the active region. Such a configuration has the potential for creating green III-nitride LEDs and LDs with improved performance and higher wall plug efficiency, which should have applications in portable projectors, heads-up displays, and laser TVs.

REFERENCES

The following publications are incorporated by reference herein:
1. D. Queren, M. Schillgalies, A. Avramescu, G. Bruderl, A. Laubsch, S. Lutgen, and U. Strauss, J. Cryst. Growth 311, 2933 (2009).
2. M. T. Hardy, F. Wu, P. Shan Hsu, D. A. Haeger, S. Nakamura, J. S. Speck, and S. P. DenBaars, J. Appl. Phys. 114 (2013).
3. S. Nakamura, N. Iwasa, M. Senoh, and T. Mukai, Jpn. J. Appl. Phys., Part 1 31, 1258 (1992).
4. T. Takeuchi, S. Sota, M. Katsuragawa, M. Komori, H. Takeuchi, H. Amano, and I. Akasaki, Jpn. J. Appl. Phys., Part 2 36, L382 (1997).
5. P. Lefebvre, A. Morel, M. Gallart, T. Taliercio, J. Allegre, B. Gil, H. Mathieu, B. Damilano, N. Grandjean, and J. Massies, Appl. Phys. Lett. 78, 1252 (2001).
6. N. Grandjean, B. Damilano, S. Dalmasso, M. Leroux, M. Laugt, and J. Massies, J. Appl. Phys. 86, 3714 (1999).
7. J. S. Im, H. Kollmer, J. Off, A. Sohmer, F. Scholz, and A. Hangleiter, Phys. Rev. B 57, R9435 (1998).
8. F. Della Sala, A. Di Carlo, P. Lugli, F. Bernardini, V. Fiorentini, R. Scholz, and J. M. Jancu, Appl. Phys. Lett. 74, 2002 (1999).
9. B. Damilano, H. Kim-Chauveau, E. Frayssinet, J. Brault, S. Hussain, K. Lekhal, P. Vennegues, P. De Mierry, and J. Massies, Appl. Phys. Express 6, 092105 (2013).
10. A. Pourhashemi, R. M. Farrell, M. T. Hardy, P. S. Hsu, K. M. Kelchner, J. S. Speck, S. P. DenBaars, and S. Nakamura, Appl. Phys. Lett. 103, 151112 (2013).
11. S. Takagi, Y. Enya, T. Kyono, M. Adachi, Y. Yoshizumi, T. Sumitomo, Y. Yamanaka, T. Kumano, S. Tokuyama, K. Sumiyoshi, N. Saga, M. Ueno, K. Katayama, T. Ikegami, T. Nakamura, K. Yanashima, H. Nakajima, K. Tasai, K. Naganuma, N. Fuutagawa, Y. Takiguchi, T. Hamaguchi, and M. Ikeda, Appl. Phys. Express 5, 082102 (2012).
12. K. Yanashima, H. Nakajima, K. Tasai, K. Naganuma, N. Fuutagawa, Y. Takiguchi, T. Hamaguchi, M. Ikeda, Y. Enya, S. Takagi, M. Adachi, T. Kyono, Y. Yoshizumi, T. Sumitomo, Y. Yamanaka, T. Kumano, S. Tokuyama, K. Sumiyoshi, N. Saga, M. Ueno, K. Katayama, T. Ikegami, and T. Nakamura, Appl. Phys. Express 5, 082103 (2012).
13. S. Nakamura, M. Senoh, S. Nagahama, N. Iwasa, T. Yamada, T. Matsushita, H. Kiyoku, Y. Sugimoto, T. Kozaki, H. Umemoto, M. Sano, and K. Chocho, Appl. Phys. Lett. 72, 211 (1998).
14. E. Kioupakis, P. Rinke, and C. G. Van de Walle, Appl. Phys. Express 3, 082101 (2010).
15. M. T. Hardy, F. Wu, C.-Y. Huang, Y. Zhao, D. F. Feezell, S. Nakamura, J. S. Speck, and S. P. DenBaars, IEEE Photonics Technol. Lett. 26, 43 (2014).
16. S. Keller, R. M. Farrell, M. Iza, Y. Terao, N. Young, U. K. Mishra, S. Nakamura, S. P. DenBaars, and J. S. Speck, Jpn. J. Appl. Phys. 52, 08JC10 (2013).
17. L. Coldren, S. Corzine, M. Masanovic. Diode Lasers and Photonic Integrated Circuits Wiley, 2012.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:
1. An opto-electronic device, comprising:
   first and second III-nitride light-emitting devices comprising laser diodes, each of the laser diodes being comprised of one or more III-nitride layers grown on or above one or more surfaces of a substrate;

wherein:
an active region and a waveguide of the first III-nitride light-emitting device are clad on both sides only by undoped or n-type III-nitride layers and are not clad by p-type III-nitride layers;
an active region and a waveguide of the second III-nitride light-emitting device are clad on opposite sides by n-type and p-type III-nitride layers;
the first III-nitride light-emitting device has a smaller band gap than the second III-nitride light-emitting device;
the first III-nitride light-emitting device is optically pumped by the second III-nitride light-emitting device;
the second III-nitride light-emitting device is electrically injected; and
a separate confinement heterostructure to increase absorption of the second III-nitride light-emitting device's optical modes by the active region of the first III-nitride light-emitting device, wherein the absorption of the light from the second III-nitride light-emitting device takes place in the waveguide of the first III-nitride light-emitting device.

2. The device of claim 1, wherein the second III-nitride light-emitting device emits light at a shorter wavelength than the first III-nitride light-emitting device, so that the light can be absorbed by the active region of the first III-nitride light-emitting device.

3. The device of claim 1, wherein the first and second III-nitride light-emitting devices are grown on opposite sides of the substrate.

4. The device of claim 3, wherein the second III-nitride light-emitting device is grown first, and the first III-nitride light-emitting device is grown after the second III-nitride light-emitting device.

5. The device of claim 1, wherein the first and second III-nitride light-emitting devices are grown on the same side of the substrate.

6. The device of claim 5, wherein the first and second III-nitride light-emitting devices share n-type III-nitride layers.

7. The device of claim 5, wherein the first III-nitride light-emitting device is grown first, and the second III-nitride light-emitting device is grown after the first III-nitride light-emitting device.

8. The device of claim 7, wherein the undoped or n-type III-nitride layers on both sides of the active region of the first III-nitride light-emitting device stabilize the active region of the first III-nitride light-emitting device during growth of the second III-nitride light-emitting device.

9. The device of claim 1, wherein the first III-nitride light-emitting device is grown on a limited area of the substrate to decrease the strain in the layers.

10. An opto-electronic device, comprising:
first and second III-nitride light-emitting devices comprised of one or more III-nitride layers grown on or above one or more surfaces of a substrate;
wherein:
the first and second III-nitride light-emitting devices are grown on opposite sides of the substrate;
the substrate is a {20-21} III-nitride substrate, the first III-nitride light-emitting device is grown on or above a (20-21) surface of the {20-21} III-nitride substrate and the second III-nitride light-emitting device is grown on or above a (20-2-1) surface of the {20-21} III-nitride substrate, or the first III-nitride light-emitting device is grown on or above a (20-2-1) surface of the {20-21} III-nitride substrate and the second III-nitride light-emitting device is grown on or above a (20-21) surface of the {20-21} III-nitride substrate;
the second III-nitride light-emitting device is grown first, and the first III-nitride light-emitting device is grown after the second III-nitride light-emitting device;
an active region of the first III-nitride light-emitting device is clad on both sides only by undoped or n-type III-nitride layers and is not clad by p-type III-nitride layers;
an active region of the second III-nitride light-emitting device is clad on opposite sides by n-type and p-type III-nitride layers;
the first III-nitride light-emitting device has a smaller band gap than the second III-nitride light-emitting device;
the first III-nitride light-emitting device is optically pumped by the second III-nitride light-emitting device; and
the second III-nitride light-emitting device is electrically injected.

11. An opto-electronic device, comprising:
first and second III-nitride light-emitting devices comprised of one or more III-nitride layers grown on or above one or more surfaces of a substrate;
wherein:
the first and second III-nitride light-emitting devices are grown on opposite sides of the substrate;
an active region of the first III-nitride light-emitting device is clad on both sides only by undoped or n-type III-nitride layers and is not clad by p-type III-nitride layers;
an active region of the second III-nitride light-emitting device is clad on opposite sides by n-type and p-type III-nitride layers;
the first III-nitride light-emitting device has a smaller band gap than the second III-nitride light-emitting device;
the first III-nitride light-emitting device is optically pumped by the second III-nitride light-emitting device;
the second III-nitride light-emitting device is electrically injected; and
a grating on or above the second III-nitride light-emitting device that diffracts light that is guided by a waveguide of the second III-nitride light-emitting device into light that is directed toward the first III-nitride light-emitting device.

12. An opto-electronic device, comprising:
first and second III-nitride light-emitting devices comprised of one or more III-nitride layers grown on or above one or more surfaces of a substrate;
wherein:
the first and second III-nitride light-emitting devices are grown on opposite sides of the substrate;
an active region of the first III-nitride light-emitting device is clad on both sides only by undoped or n-type III-nitride layers and is not clad by p-type III-nitride layers;
an active region of the second III-nitride light-emitting device is clad on opposite sides by n-type and p-type III-nitride layers;
the first III-nitride light-emitting device has a smaller band gap than the second III-nitride light-emitting device;
the first III-nitride light-emitting device is optically pumped by the second III-nitride light-emitting device;
the second III-nitride light-emitting device is electrically injected; and a mirror on or above the second III-nitride light-emitting device that reflects light that is propagating away from the first III-nitride light-emitting device towards the first III-nitride light-emitting device.

13. An opto-electronic device, comprising:
first and second III-nitride light-emitting devices comprised of one or more III-nitride layers grown on or above one or more surfaces of a substrate;
wherein:
the first and second III-nitride light-emitting devices are grown on opposite sides of the substrate;
an active region of the first III-nitride light-emitting device is clad on both sides only by undoped or n-type III-nitride layers and is not clad by p-type III-nitride layers;
an active region of the second III-nitride light-emitting device is clad on opposite sides by n-type and p-type III-nitride layers;
the first III-nitride light-emitting device has a smaller band gap than the second III-nitride light-emitting device;
the first III-nitride light-emitting device is optically pumped by the second III-nitride light-emitting device;
the second III-nitride light-emitting device is electrically injected; and
a grating on or above the first III-nitride light-emitting device that diffracts light that is directed away from the first III-nitride light-emitting device into light that is guided by a waveguide of the first III-nitride light-emitting device.

14. An opto-electronic device, comprising:
first and second III-nitride light-emitting devices comprised of one or more III-nitride layers grown on or above one or more surfaces of a substrate;
wherein:
the first and second III-nitride light-emitting devices are grown on opposite sides of the substrate;
an active region of the first III-nitride light-emitting device is clad on both sides only by undoped or n-type III-nitride layers and is not clad by p-type III-nitride layers;
an active region of the second III-nitride light-emitting device is clad on opposite sides by n-type and p-type III-nitride layers;
the first III-nitride light-emitting device has a smaller band gap than the second III-nitride light-emitting device;
the first III-nitride light-emitting device is optically pumped by the second III-nitride light-emitting device;
the second III-nitride light-emitting device is electrically injected; and
a mirror on or above the first III-nitride light-emitting device that reflects light that is directed perpendicular to an optical cavity of the first III-nitride light-emitting device.

15. An opto-electronic device, comprising:
first and second III-nitride light-emitting devices comprised of one or more III-nitride layers grown on or above one or more surfaces of a substrate;
wherein:
the first and second III-nitride light-emitting devices are grown on the same side of the substrate;
the substrate is a {20-21} III-nitride substrate, and both the first and second III-nitride light-emitting devices are grown on or above a (20-21) surface of the {20-21} substrate or both the first and second III-nitride light-emitting devices are grown on or above a (20-2-1) surface of the {20-21} substrate;
an active region of the first III-nitride light-emitting device is clad on both sides only by undoped or n-type III-nitride layers and is not clad by p-type III-nitride layers;
an active region of the second III-nitride light-emitting device is clad on opposite sides by n-type and p-type III-nitride layers;
the first III-nitride light-emitting device has a smaller band gap than the second III-nitride light-emitting device;
the first III-nitride light-emitting device is optically pumped by the second III-nitride light-emitting device; and
the second III-nitride light-emitting device is electrically injected.

16. An opto-electronic device, comprising:
first and second III-nitride light-emitting devices comprised of one or more III-nitride layers grown on or above one or more surfaces of a substrate;
wherein:
the first and second III-nitride light-emitting devices are grown on the same side of the substrate;
an active region of the first III-nitride light-emitting device is clad on both sides only by undoped or n-type III-nitride layers and is not clad by p-type III-nitride layers;
an active region of the second III-nitride light-emitting device is clad on opposite sides by n-type and p-type III-nitride layers;
the first III-nitride light-emitting device has a smaller band gap than the second III-nitride light-emitting device;
the first III-nitride light-emitting device is optically pumped by the second III-nitride light-emitting device;
the second III-nitride light-emitting device is electrically injected; and
a photonic crystal to improve overlap of the second III-nitride light-emitting device's optical modes with the active region of the first III-nitride light-emitting device.

17. A method of fabricating an opto-electronic device, comprising:
growing first and second III-nitride light-emitting devices comprising laser diodes, each of the laser diodes being comprised of one or more III-nitride layers grown on or above one or more surfaces of a substrate;
wherein:
an active region and a waveguide of the first III-nitride light-emitting device are clad on both sides only by undoped or n-type III-nitride layers and are not clad by p-type III-nitride layers;
an active region and a waveguide of the second III-nitride light-emitting device are clad on opposite sides by n-type and p-type III-nitride layers;
the first III-nitride light-emitting device has a smaller band gap than the second III-nitride light-emitting device;
the first III-nitride light-emitting device is optically pumped by the second III-nitride light-emitting device
the second III-nitride light-emitting device is electrically injected; and
a separate confinement heterostructure to increase absorption of the second III-nitride light-emitting device's optical modes by the active region of the first III-nitride light-emitting device, wherein the absorption of the light from the second III-nitride light-emitting device takes place in the waveguide of the first III-nitride light-emitting device.

\* \* \* \* \*